United States Patent
Brachert et al.

(10) Patent No.: US 7,898,874 B2
(45) Date of Patent: Mar. 1, 2011

(54) MEMORY DEVICE

(75) Inventors: Jost Brachert, Ditzengen (DE); Uwe Heller, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 111 days.

(21) Appl. No.: 12/227,096

(22) PCT Filed: Apr. 17, 2007

(86) PCT No.: PCT/EP2007/053706

§ 371 (c)(1),
(2), (4) Date: Mar. 5, 2009

(87) PCT Pub. No.: WO2007/128653

PCT Pub. Date: Nov. 15, 2007

(65) Prior Publication Data

US 2009/0213676 A1 Aug. 27, 2009

(30) Foreign Application Priority Data

May 10, 2006 (DE) .................. 10 2006 021 746

(51) Int. Cl.
*G11C 7/10* (2006.01)
(52) U.S. Cl. .................. 365/189.05; 365/226; 365/148; 365/164; 365/210.12
(58) Field of Classification Search ............... 365/226, 365/189.05, 148, 149, 164, 208, 210.12
See application file for complete search history.

(56) References Cited

U.S. PATENT DOCUMENTS

| 5,574,690 | A | 11/1996 | Kesel et al. |
| 6,728,796 | B2 | 4/2004 | Aue et al. |
| 6,753,722 | B1 | 6/2004 | Kondapalli et al. |
| 6,771,200 | B2 | 8/2004 | Frulio et al. |
| 6,791,893 | B2 | 9/2004 | Pekny et al. |
| 2003/0123218 | A1 | 7/2003 | Zimmermann et al. |
| 2006/0069870 | A1* | 3/2006 | Nicholson et al. ........... 711/118 |

FOREIGN PATENT DOCUMENTS

| CN | 1169204 | 12/1997 |
| DE | 4317175 | 11/1994 |
| DE | 10003006 | 7/2001 |
| EP | 1252627 | 12/2003 |

OTHER PUBLICATIONS

International Search Report, PCT International Patent Application No. PCT/EP2007/053706, dated Jul. 20, 2007.

* cited by examiner

*Primary Examiner*—Thong Q Le
(74) *Attorney, Agent, or Firm*—Kenyon & Kenyon LLP

(57) ABSTRACT

A nonvolatile memory device contains at least one nonvolatile memory module and an electrical buffer for buffering a supply voltage for the at least one nonvolatile memory module. A microprocessor may be connected in parallel or serial fashion to the memory device, or may contain the memory device.

8 Claims, 2 Drawing Sheets

MEMORY DEVICE

FIELD OF THE INVENTION

The present invention relates to a memory device and a microprocessor device, in particular a control unit of a motor vehicle.

In control units, it is often necessary to store data that need to be retained when the control unit is switched off. The present invention relates, in particular, to the manner of storing data in a separate memory module.

BACKGROUND INFORMATION

A memory device is described in German Patent Application No. DE 43 17 175 A1. European Patent Application No. EP 1 252 627 B1 describes an assemblage for supplying voltage to a volatile semiconductor memory. German Patent Application No. DE 100 03 006 A1 describes an assemblage and method for signal processing and storage in which filter coefficients are stored in a RAM memory region that is separate from a microprocessor.

It is furthermore conventional to store in a separate module (e.g., an EEPROM) nonvolatile data. For this, the data are transferred via a communication line, for example a bus, to said module. Both this transfer and the nonvolatile storage operation require a specific period of time. If the supply voltage to the control unit is interrupted during this period of time, the storage operation is then also interrupted, and the data in the memory module are incomplete and inconsistent. To prevent this, complex actions—for example, multiple storage in the EEPROM, temporary data retention in the application microprocessor—have hitherto been taken under the control of software in the microprocessor on which the applications are running (application microprocessor) to ensure the consistency and completeness of the data. Nevertheless, it is at present impossible to preclude the occurrence of data losses. This can result in field feedbacks and complex error investigations.

SUMMARY

An object of the present invention to make available a nonvolatile memory device that permits secure and consistent storage of data without complex control software in a microprocessor (application microprocessor) communicating with the memory device.

This object may be achieved by a nonvolatile memory device for nonvolatile storage of data that contains at least one nonvolatile memory module and an electrical buffer for buffering a supply voltage for the at least one nonvolatile memory module. This object may be achieved in particular by an intelligent memory module with voltage buffering.

One example aspect of the present invention involves providing an electrical buffer for buffering a supply voltage for the at least one nonvolatile memory module.

The nonvolatile memory module will hereinafter be referred to simply as a "memory module."

The present invention may have the advantage that, because data security and data consistency in the nonvolatile memory module are guaranteed, the complex software-based data integrity features in the application microprocessor may be omitted. More memory and runtime are thus available for applications in the microprocessor.

Both development outlay for control units and production support troubleshooting are much reduced.

According to an example embodiment of the present invention, the at least one memory module contains a separate voltage supply with its own buffering system. This buffering system is considerably less expensive than buffering the application microprocessor supply system, since the energy demand of the memory module or modules is substantially lower than that of the application microprocessor.

According to an example embodiment of the present invention, the memory module autonomously handles data storage and data presentation with respect to the application microprocessor. It independently handles data security and consistency in the event of an interruption in the storage operation.

BRIEF DESCRIPTION OF THE DRAWINGS

The present invention will be further explained below with reference to exemplifying embodiments.

DETAILED DESCRIPTION OF EXAMPLE EMBODIMENTS

Figure 1:
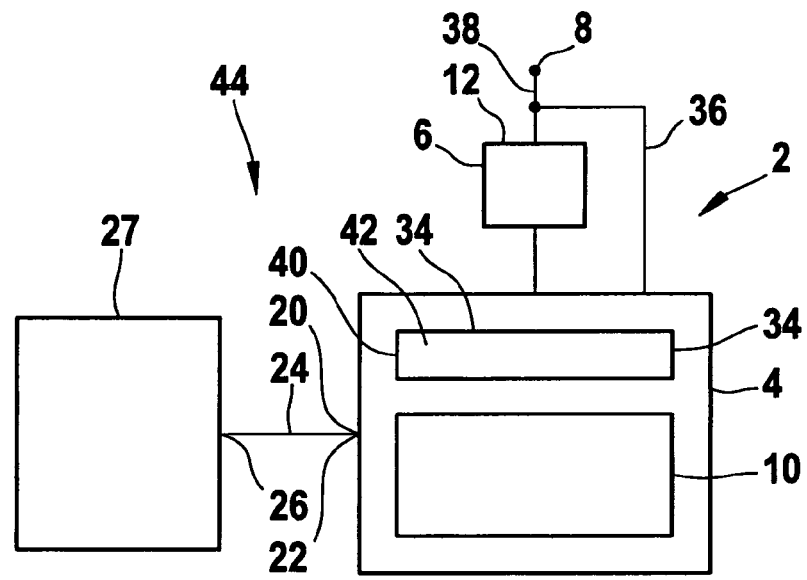
FIG. 1 shows an example embodiment of a memory device according to the present invention in a microprocessor device.

FIGS. 1 to 4 each show a nonvolatile memory device 2 for storing nonvolatile data, containing a nonvolatile memory module 4 and an electrical buffer 6 for buffering a supply voltage for the at least one nonvolatile memory module 4. The supply voltage is furnished by a suitable energy source 8, shown in the figures as a supply connection.

Nonvolatile memory module 4 contains a nonvolatile data memory 10. Nonvolatile data memory 10 may be constituted, for example, by an EEPROM (electrically erasable programmable read-only memory) or by multiple EEPROMs.

Electrical buffer 6 preferably buffers exclusively the supply voltage of nonvolatile memory module 4.

According to an example embodiment of a nonvolatile memory device 2, electrical buffer 6 contains a voltage regulating module 12 (FIG. 1). In particular, provision may be made for electrical buffer 6 to be made up of a voltage regulating module 12.

Figure 3:
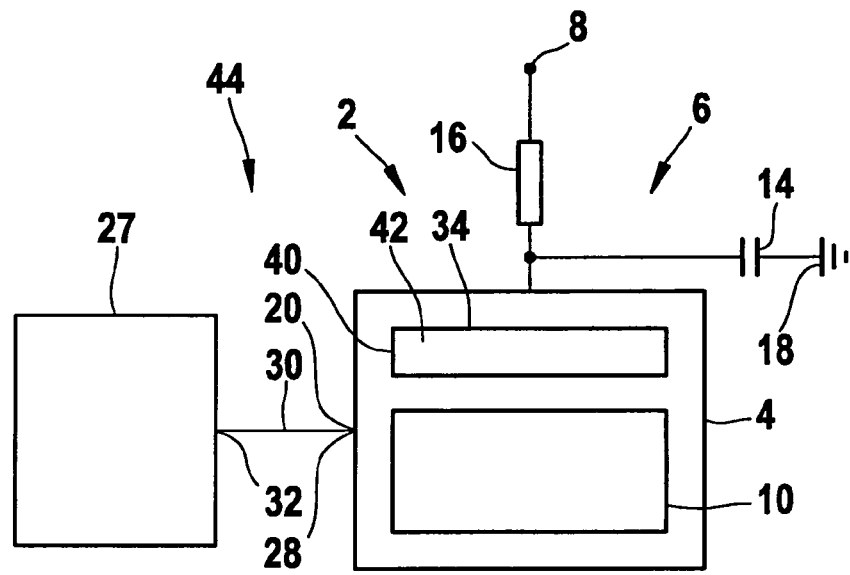
FIG. 3 shows yet another embodiment of a memory device according to the present invention in a microprocessor device.

According to a further example embodiment of a nonvolatile memory device 2, electrical buffer 6 is made up of a capacitance 14 and a series resistor 16. Capacitance 14 may be constituted, for example, by a capacitor. Capacitance 14 is preferably connected in parallel with the nonvolatile memory module. In particular, capacitance 14 may be connected to ground in parallel with the nonvolatile memory module. Series resistance 16 is connected in series with memory module 4 and with capacitance 14, as depicted in FIG. 3.

In normal operation, capacitance 14 is charged through series resistance 16. If the supply voltage then collapses, memory module 4 is powered by capacitance 14, with the result that a memory operation that might possibly still be running may be completed.

Figure 2:
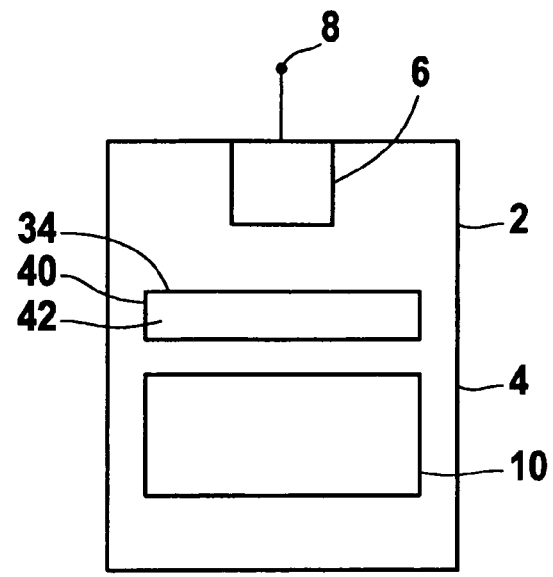
FIG. 2 shows a further embodiment of a memory device according to the present invention.

Electrical buffer 6 may be disposed inside memory module 4, as depicted in FIG. 2. In addition, electrical buffer 6 may be disposed outside memory module 4, as depicted in FIG. 1 and FIG. 3.

Memory module 4 may have a communication connector 20 for data transfer. Communication connector 20 may be a serial communication connector 22 for serial data transfer connection 24 of memory module 4 to a corresponding communication connector 26 of a peripheral, for example a microprocessor 27, in particular an application microprocessor 27 on which application programs run. This is depicted by way of example in FIG. 1.

Alternatively, memory module 4 may have, instead of serial communications connector 22, a parallel communications connector 28 for creating a parallel data transfer connection 30 to a corresponding parallel communication connector 32 of the peripheral.

Memory module 4 may have a voltage monitoring device 34. Voltage monitoring device 34 may be connected, for voltage monitoring, via a measurement line 36 to a voltage supply line 38 between an energy source 8 and electrical buffer 6, as depicted in FIG. 1.

According to an example embodiment of the present invention, nonvolatile memory module 4 contains a control logic unit 40 for maintaining the data and ensuring data consistency in data memory 10.

According to an example embodiment of the present invention, memory module 4 has a driver 42 for presenting the data memory at communication connector 20, in terms of structure and behavior, in the form of a random-access memory (RAM) module. Memory module 4 according to the present invention therefore presents itself, for a microprocessor 27 connected to communication connector 20, as a RAM module. Driver 42 may be constituted by control logic unit 40 for memory module 4.

The present invention further relates to a microprocessor device 44, in particular a control unit 46 of a motor vehicle, containing a microprocessor 27 and at least one of the nonvolatile memory devices 2 described above.

Figure 4:
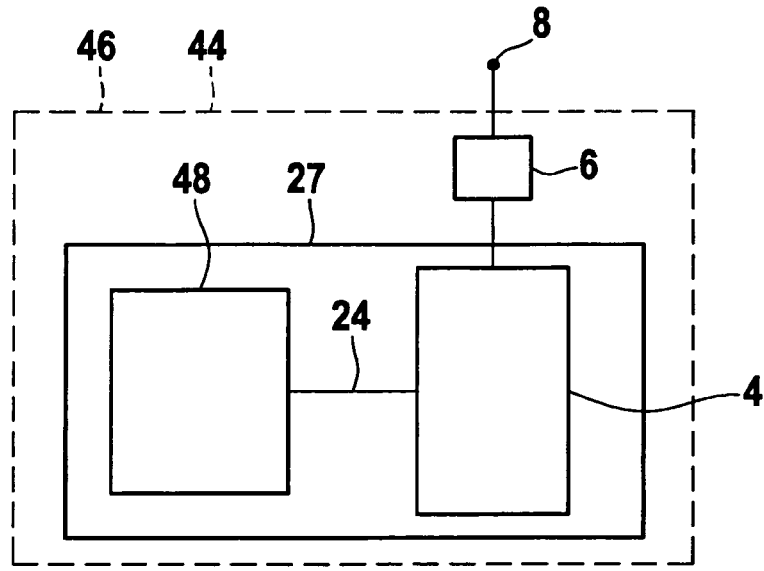
FIG. 4 shows an embodiment of a microprocessor device according to the present invention.

According to an example embodiment of a microprocessor device 44, nonvolatile memory module 4 forms a part of microprocessor 27 (FIG. 4). This may occur, for example, in the form of an application-specific integrated circuit (ASIC). In this example embodiment, nonvolatile memory module 4 communicates with a processor core 48 of microprocessor 27, for example via a serial data transfer connection 24 (FIG. 4) or via a parallel data transfer connection 30.

The present invention is not limited to the example embodiments depicted in the figures. Rather it arises from an overall consideration, by one skilled in the art, of the description, the figures, the claims, and the variants mentioned, but without being limited thereto.

In a departure from the example embodiments depicted in the drawings, a memory device 2 may also contain two or more nonvolatile memory modules 4.

What is claimed is:

1. A nonvolatile memory device for nonvolatile storage of data, comprising:
   at least one nonvolatile memory module; and
   an electrical buffer for buffering a supply voltage for the at least one nonvolatile memory module, such that in the event of a failure of the supply voltage, the buffer ensures power to the memory module until a memory operation that is running may be completed, wherein the electrical buffer is made up of a capacitance and a series resistance, the capacitance being connected in parallel with the nonvolatile memory module, and the series resistance being connected in series with the memory module and the capacitance.

2. The memory device as recited in claim 1, wherein the electrical buffer buffers the supply voltage exclusively for the nonvolatile memory module.

3. The memory device as recited in claim 1, wherein the electrical buffer is disposed inside the memory module.

4. The memory device as recited in claim 1, wherein the memory module is embodied to present data at a communication connector, in terms of structure and behavior, in the form of data of an external RAM module.

5. The memory device as recited in claim 1, wherein the memory module has a voltage monitoring device.

6. The memory device as recited in claim 1, wherein the nonvolatile memory module contains a control logic unit for maintaining the data and ensuring data consistency in the data memory.

7. A microprocessor device, comprising:
   a microprocessor; and
   a memory device, the memory device comprising:
      at least one nonvolatile memory module; and
      an electrical buffer for buffering a supply voltage for the at least one nonvolatile memory module, such that in the event of a failure of the supply voltage, the buffer ensures power to the memory module until a memory operation that is running may be completed, wherein the electrical buffer is made up of a capacitance and a series resistance, the capacitance being connected in parallel with the nonvolatile memory module, and the series resistance being connected in series with the memory module and the capacitance.

8. A microprocessor device, comprising:
   a microprocessor in which at least one nonvolatile memory module is integrated; and
   a memory device comprising an electrical buffer for buffering a supply voltage for the at least one nonvolatile memory module, such that in the event of a failure of the supply voltage, the buffer ensures power to the memory module until a memory operation that is running may be completed, wherein the electrical buffer is made up of a capacitance and a series resistance, the capacitance being connected in parallel with the nonvolatile memory module, and the series resistance being connected in series with the memory module and the capacitance.

* * * * *